United States Patent
Pourkeramati et al.

(10) Patent No.: US 7,449,350 B2
(45) Date of Patent: Nov. 11, 2008

(54) STRUCTURE AND METHOD FOR PARALLEL TESTING OF DIES ON A SEMICONDUCTOR WAFER

(75) Inventors: Ali Pourkeramati, Redwood City, CA (US); Eungjoon Park, Fremont, CA (US)

(73) Assignee: Frontenac Ventures, Las Vegas, NV (US)

( * ) Notice: Subject to any disclaimer, the term of this patent is extended or adjusted under 35 U.S.C. 154(b) by 0 days.

(21) Appl. No.: 11/614,252

(22) Filed: Dec. 21, 2006

(65) Prior Publication Data

US 2007/0099312 A1    May 3, 2007

Related U.S. Application Data

(60) Division of application No. 10/340,558, filed on Jan. 9, 2003, now Pat. No. 7,173,444, which is a continuation-in-part of application No. 09/542,802, filed on Apr. 4, 2000, now Pat. No. 6,323,639.

(51) Int. Cl.
*G01R 31/26* (2006.01)

(52) U.S. Cl. ...................................................... 438/17

(58) Field of Classification Search ............. 438/11–18, 438/100, 105–107, 597, 612–613, 660–667; 257/48, 737

See application file for complete search history.

(56) References Cited

U.S. PATENT DOCUMENTS 5,366,906 A * 11/1994 Wojnarowski et al. ........ 438/17
7,122,829 B2 * 10/2006 Lunde .......................... 257/48

* cited by examiner

*Primary Examiner*—Scott B. Geyer
*Assistant Examiner*—Andre Stevenson
(74) *Attorney, Agent, or Firm*—McDonnell Boehnen Hulbert & Berghoff LLP

(57) ABSTRACT

In accordance with an embodiment of the present invention, a semiconductor wafer has a plurality of dies each having a circuit and a plurality of contact pads. The plurality of contact pads include a first contact pad to receive a power supply voltage, a second contact pad to receive a ground voltage, and a third contact pad to receive a test control signal. The third contact pad is connected to a programmable self-test engine (PSTE) embedded on the corresponding die so that the test control signal activates the PSTE to initiate a self-test. A probe card has a plurality of sets of probe pins, each set of probe pins having three probe pins for contacting the first, second, and third contact pads of one of a corresponding number of the plurality of dies. During wafer test, the plurality of sets of probe pins come in contact with a corresponding number of dies so that the self-test is carried out simultaneously in the corresponding number of dies.

18 Claims, 4 Drawing Sheets

STRUCTURE AND METHOD FOR PARALLEL TESTING OF DIES ON A SEMICONDUCTOR WAFER

CROSS-REFERENCES TO RELATED APPLICATIONS

This application is a divisional application of U.S. application Ser. No. 10/340,558, filed Jan. 9, 2003, entitled "Structure and Method for Parallel Testing of Dies on a Semiconductor Wafer," which is a continuation-in-part of U.S. application Ser. No. 09/542,802, filed Apr. 4, 2000, entitled "Powering Dies on a Semiconductor Wafer Through Wafer Scribe Line Areas", which disclosure is incorporated herein by reference.

BACKGROUND OF THE INVENTION

The present invention relates in general to the semiconductor technology and more particularly to structures and methods for testing wafer.

The rapid advancement in the semiconductor industry has enabled manufacturing of highly complex integrated circuits (ICs). Such ICs are being fabricated on large wafers capable of housing a greater number of dies. Also, with the advancement in the IC packaging technology, smaller packages with significantly higher pin-count have become commercially available. A larger number of pads can thus be placed on each die. This has in turn resulted in a significantly more complex set of test requirements and a substantial increase in the time required to test all dies on a wafer.

FIG. 1 shows a top view of a wafer 100 having multiple dies 102 organized in rows and columns separated by horizontal scribe lines 104 and vertical scribe lines 106. After wafer sort (i.e., testing all the dies on a wafer to identify non-functional dies), the good dies are extracted from the wafer by sawing along the vertical and horizontal scribe lines and then placed in the desired packages. Wafer sort is usually carried out using a probe card connected to a tester. The probe card sequentially contacts each die on the wafer until all dies have been tested.

Techniques wherein multiple dies are tested simultaneously are widely used to reduce wafer sort time. However, the number of dies that can be tested at the same time is limited by the number of pins that a tester can support divided by the number of pins on each die (the current testers are limited to few hundred pins).

Accordingly, there is a need for structures and methods for efficiently testing dies on a wafer.

BRIEF SUMMARY OF THE INVENTION

In accordance with an embodiment of the present invention, a semiconductor wafer has a plurality of dies each having a circuit and a plurality of contact pads. The plurality of contact pads include a first contact pad to receive a power supply voltage, a second contact pad to receive a ground voltage, and a third contact pad to receive a test control signal. The third contact pad is connected to a programmable self-test engine (PSTE) embedded on the corresponding die so that the test control signal activates the PSTE to initiate a self-test. A probe card has a plurality of sets of probe pins, each set of probe pins having three probe pins for contacting the first, second, and third contact pads of one of a corresponding number of the plurality of dies. During wafer test, the plurality of sets of probe pins come in contact with a corresponding number of dies so that the self-test is carried out simultaneously in the corresponding number of dies.

In accordance with another embodiment, a semiconductor wafer has a plurality of dies separated by scribe line areas, and one or more conductor lines extend through at least a portion of the scribe line areas.

In one embodiment, at least one of the one or more conductor lines has at least one contact pad.

In accordance with another embodiment, a semiconductor wafer has a plurality of dies separated by scribe line areas. A plurality of contact pads are located in the scribe line areas. At least one of the plurality of contact pads is routed into one of the plurality of dies.

In accordance with another embodiment, a method for testing a wafer which has a plurality of dies separated by scribe line areas, and one or more conductor lines extending through at least a portion of the scribe line areas, is as follows. A wafer is placed in a tester for testing the plurality of dies. A self-test operation is simultaneously initiated in a predetermined number of the plurality of dies by bringing a probe card coupled to the tester in electrical contact with fewer number of dies than the predetermined number.

In accordance with another embodiment, a wafer has a plurality of dies separated by scribe line areas, and a plurality of contact pads in the scribe line areas. At least one of the plurality of contact pads is routed into one of the plurality of dies. A method of testing such wafer is as follows. The wafer is placed in a tester for testing the plurality of dies. A probe card coupled to the tester is brought in electrical contact with the plurality of pads in the scribe line areas to initiate a self-test operation in a predetermined number of the plurality of dies.

In accordance with another embodiment of the invention, a wafer has a plurality of dies separated by scribe line areas, and a plurality of conductor lines extending through at least a portion of the scribe line areas. The plurality of conductor lines are selectively routed into predesignated groups of dies. One of more of the plurality of conductor lines has at least one contact pad. A method of testing such a wafer is as follows. The wafer is placed in a tester for testing the plurality of dies. A probe card coupled to the tester is brought in electrical contact with the at least one contact pad of the one or more of the plurality of conductor lines extending in the scribe line areas to initiate a self-test operation in at least one of the predesignated groups of dies.

Other features and advantages of the present invention will become apparent from the following detailed description when taken in conjunction with the accompanying drawings.

DETAILED DESCRIPTION OF THE INVENTION

In accordance with the invention, methods and structures for wafer level test of semiconductor dies organized on the wafer in a matrix of rows and columns are provided. A programmable self-test engine (PSTE) housed in each die enables self-test to be performed in each die by only supplying power, ground, and one or more test signals. This in turn enables simultaneous testing of a larger number of dies than was previously possible since the tester needs to contact only few (e.g., 3 or 4) contact pads on each die to initiate the self-test. In one embodiment, the few contact pads are located in the scribe line areas rather than inside each die. In another embodiment, the few contact pads on each die are coupled to corresponding metal lines extending through the scribe line areas. In yet another embodiment, contact pads are provided on the metal lines extending through the scribe line areas so that the tester can directly contact these metal lines.

Figure 1:
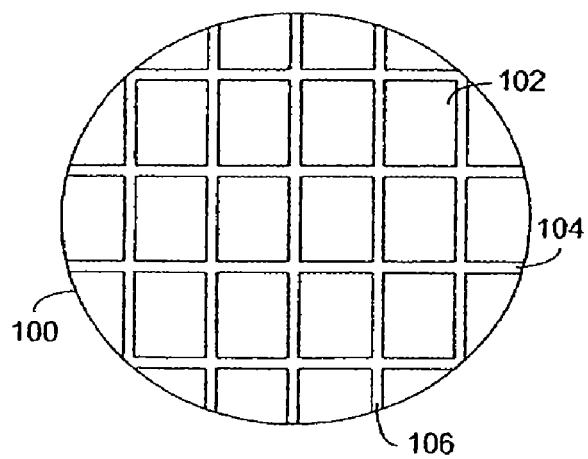
FIG. 1 is a schematic diagram of a conventional wafer containing dies separated by scribe lines areas.
Figure 2A:
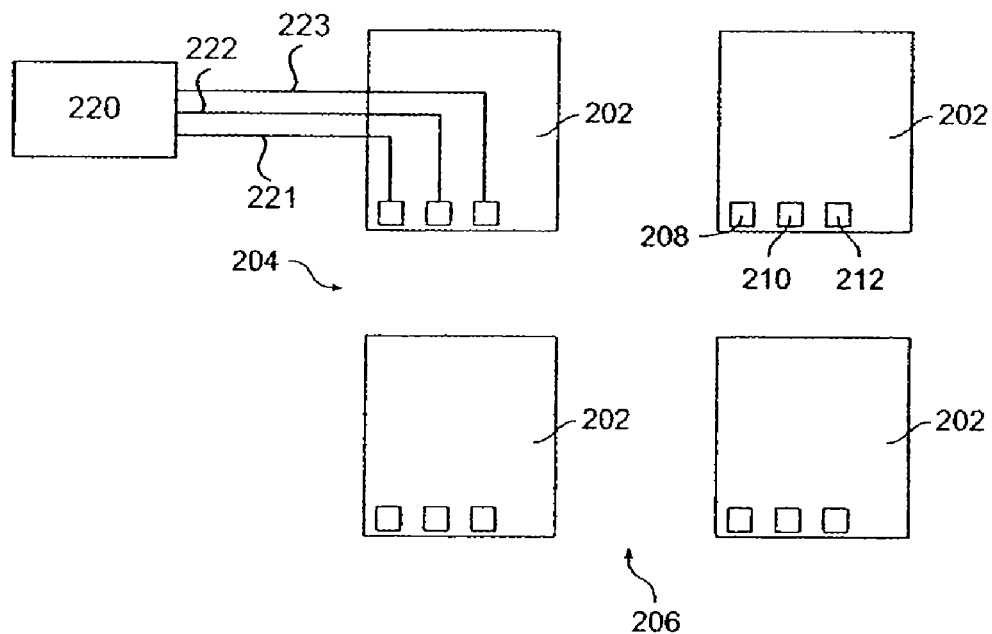
FIGS. 2a and 2b are schematic diagrams of a portion of a wafer showing dies with internal test pads in accordance with two embodiments of the invention.

FIG. 2A shows a portion of a wafer having dies 202 separated from each other by horizontal scribe lines 204 and vertical scribe lines 206. Each die has, in addition to the pads normally used for the purpose of electrically connecting the die to the pins of a package, three pads 208, 210, 212 that are used for the purpose of wafer sort. Alternatively, one, two, or all of pads 208, 210, and 212 are used both for the purpose of wafer sort as well as for normal die functions (i.e., are connected to pins of the package).

Pad 208 is configured to receive the power supply otherwise referred to as Vcc, Vdd, or other common notations of the industry, and hereinafter referred to as Vcc. Pad 210 is configured to receive the ground potential, otherwise referred to as GND, Vss, or other common notations of the industry, and hereinafter referred to as Vss. Pad 212 is configured to receive a signal for activating a programmable self-test engine (PSTE) incorporated in die 202. More details of the PSTE are provided further below.

During wafer test, only pads 208, 210 and 212 are coupled to the tester through a probe card. Multiple dies, in fact as many as can be handled satisfactorily by the probe card and the tester, can be tested simultaneously. The tester supplies both Vcc and Vss on respective pads 208 and 210, and then supplies a self-test activate signal on pad 212 to activate PSTE. The Probe card remains in contact with the dies until the test is complete. In another embodiment, pad 212 is also an input/out (IO) pad capable of indicating whether the self-test is successfully completed. In one embodiment, pads 208, 210 and 212 are routed to the PSTE only, and thus are not used once the die is packaged. The invention, however, is not limited as such, and the Vcc pad 208 and Vss pad 210 may be routed to supply power to both the PSTE and other circuit blocks on a die.

Unlike built-in self-test (BIST) mechanisms, the PSTE allows changing certain test parameters through the tester (i.e., the PSTE has programming capability). This feature is essential in testing of most semiconductor devices and is commonly used during the development of test programs or for the purpose of debugging a faulty die. The programmability of the PSTE allows for, but is not limited to, changing the order in which certain portions of the die are tested, changing the sequences of test conditions, and changing the test parameters. Accordingly, pin 212, other than being used for activating the PSTE and providing test result information, may also be used for the purpose of loading data to be programmed into the PSTE memory.

Designing an interface that allows the extraction of a clock from the data provided on pin 212 would be obvious to one skilled in this art. Schemes such as Manchester coding could be used for this purpose. In another embodiment, PSTE memory may be pre-loaded with initial self-test sequences and parameters. In yet another embodiment, the PSTE can be designed to provide information about the test results based on information stored in PSTE internal registers. This information may include, but is not limited to, success or failure of the test, identification of failure, position of failed bits in memory tests (where the dies contain memory), action taken to override bit failures in memory, reference to operational voltages, and so on. Information may be transmitted in a manner requiring clock extraction, if necessary.

Figure 2B:
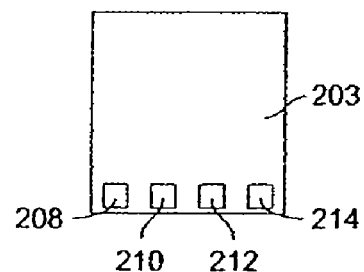

FIG. 2B shows another embodiment of the present invention wherein in addition to the three pads 208, 210, 212, pad 214 is provided for wafer sort purposes. Pad 214 is used to supply a clock signal to the PSTE. The clock signal helps make both loading of the test data as well as extracting test results simpler, thus simplifying the on-die circuitry.

Figure 3:
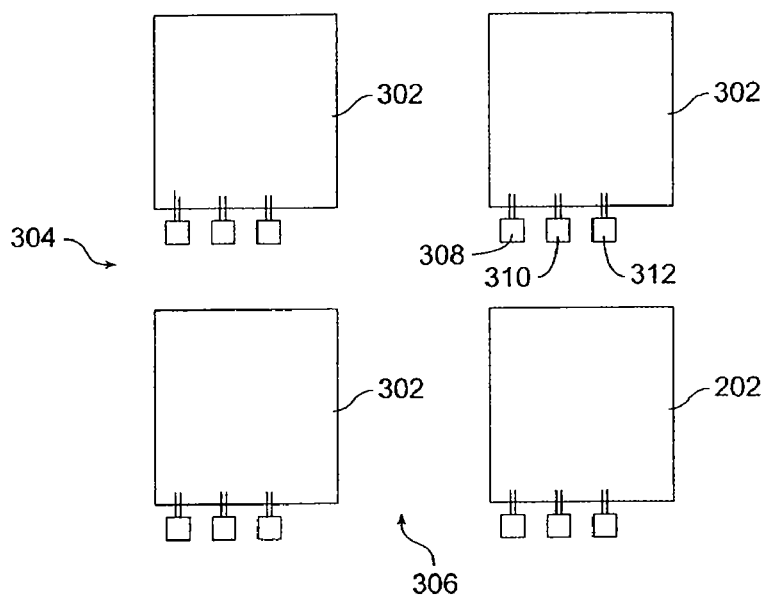
FIG. 3 is a schematic diagram of a portion of a wafer showing dies with test pads located in the scribe line areas in accordance with another embodiment of the invention.

FIG. 3 shows a portion of a wafer having dies 302 separated from each other by horizontal scribe lines 304 and vertical scribe lines 306. The wafer layout is similar to the embodiment in FIG. 2A, except that the three pads (used solely for wafer sort) on each die are placed in scribe line areas rather than on the die. Each of three pads 308, 310, 312 is electrically connected to circuitry inside the corresponding die via short interconnect lines. Pad 308 is configured to receive Vcc, pad 310 is configured to receive Vss, and pad 312 is configured to receive a signal for activating PSTE in the respective die.

The wafer sort operation is similar to that described in connection with FIG. 2A except that the probe card must be modified to contact pads in the scribe line areas. Also, in the FIG. 3 embodiment, when extracting good dies from the wafer by sawing along the scribe lines, the pads in the scribe line areas are eliminated or destroyed. The variations of the FIG. 2A embodiment described above may also be implemented in the FIG. 3 embodiment. Further, similar to the FIG. 2B embodiment, a fourth pad (not shown) may be added for each die in the scribe line area for the purpose of supplying a dedicated clock signal to the PSTE. In yet another embodiment, pad 312 is used for the purpose of providing a reference voltage. In yet another embodiment, in the case where a reference voltage input is required, another pad is added. Different voltages may be provided to the dies via this additional pad for testing purposes. This eliminates the need for incorporating on-chip reference voltage generators. In a further embodiment, the voltage reference pad is also used for the purpose of providing a clock while the PSTE is being programmed, simplifying the design of PSTE so that no self-extraction of a clock is required.

Figure 4:
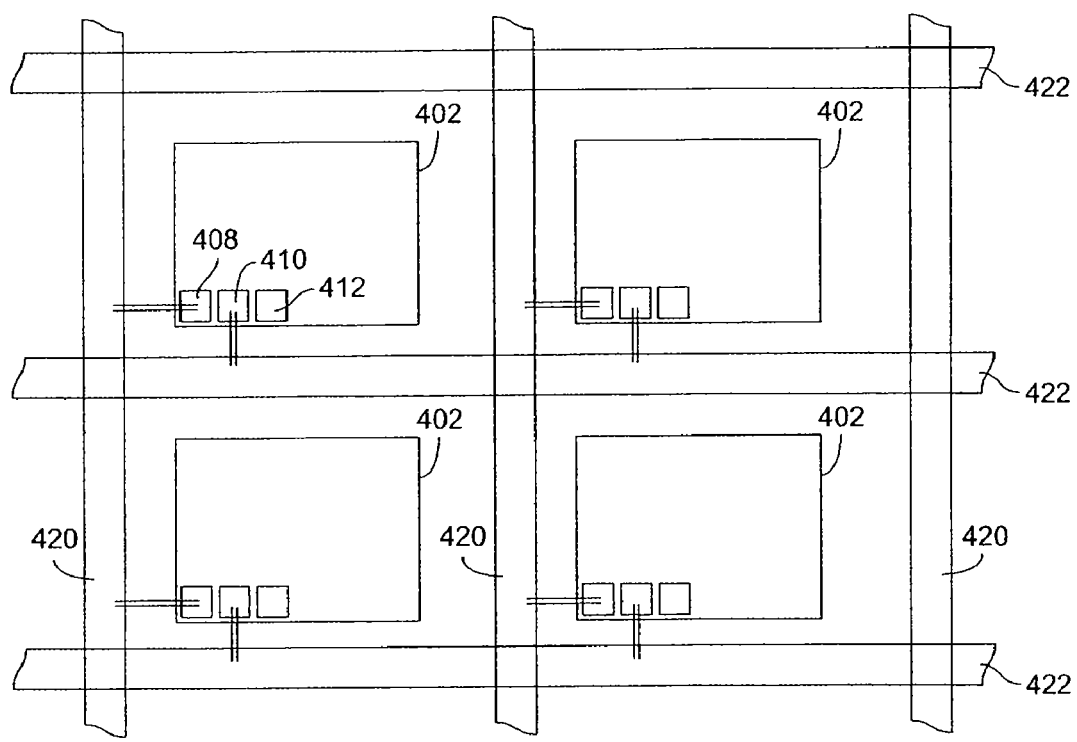
FIGS. 4 and 5 are schematic diagrams showing conductor lines extending through scribe line areas in accordance with two embodiments of the invention.

FIG. 4 shows a portion of a wafer with dies 402 separated by vertical and horizontal scribe line areas, in accordance with another embodiment of the present invention. Interconnect metal lines 420 and 422 are routed through the scribe line areas and extend perpendicularly to one another. Metal lines 420 extend vertically through the scribe line areas and are connected to pads 408 (Vcc) of different dies, and metal lines 422 extend horizontally through the scribe line areas and are connected to pads 410 (Vss) of different dies. Vertically-extending lines 420 may be from a different layer metal than horizontally-extending lines 422. This achieves physical separation between Vcc and Vss power signals. Further, by running Vcc lines and the Vss lines perpendicular to each other (rather than in parallel through same scribe line areas), the possibility of electrical shorts between the Vcc and Vss lines during the sawing process is significantly reduced. As can be seen, this embodiment reduces the number of probe-card pins required to simultaneously test multiple dies as compared to previous embodiments.

In one embodiment, metal lines 420 and 422 extend across the entire length of the wafer. In another embodiment, metal lines 420 and 422 extend only through a specified field of the wafer. For example, a field containing 12 dies organized in three rows by four columns may be repeated throughout the wafer.

As in previous embodiments, pad 412 may be used as an input/out (IO) pad, capable of indicating if a die 402 under test has completed successfully the self test. Alternatively, pad 430 may be used for the purpose of providing a reference voltage.

It should be noted that same test procedure would apply even if only specific fields containing a number of dies as mentioned above are tested. In this case, the test procedure will repeat several times until all tests are completed. A person skilled in the art could easily modify the scheme of pads internal to die 402 to pads placed in the scribe line. The pads would be connected directly to lines 420 and 422 respectively and then routed into each die. In yet another embodiment, test pads 412 are also placed in the scribe line and routed to corresponding dies. In yet another embodiment, specifically in the case where a reference voltage input is required, another pad is added.

In the embodiment where the test program and/or parameters, collectively the "test data", are to be loaded into the PSTE, this can be done by loading such test data in parallel in all dies. However, after all dies are tested, each die may contain different test results requiring each die to be individually accessed for the test result information. In one approach, the probe card can provide power and ground to one column and one row of dies at a time, resulting in the ability to read the test result from a single die. The process can be repeated until all dies are read. In the case where the power and ground lines cover a predefined field, the probe card would be able to examine in parallel test information from multiple dies.

Figure 5:
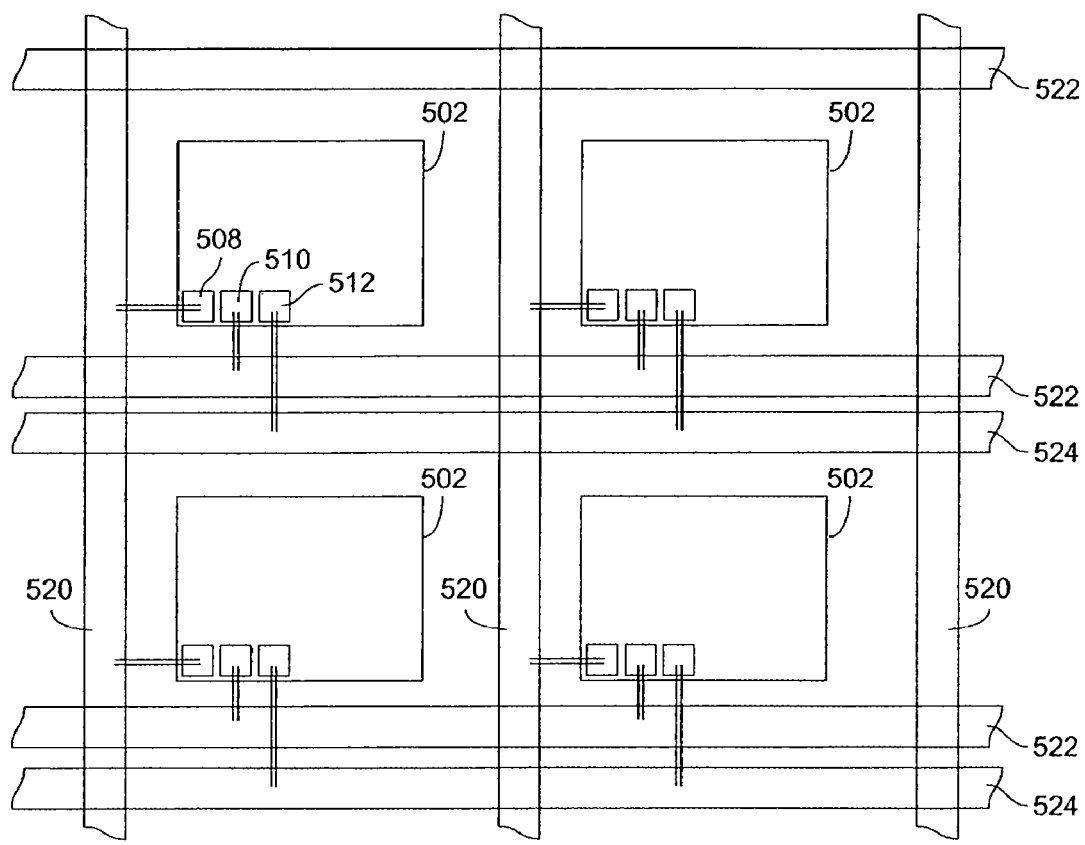

Reference is now made to FIG. 5 where an additional horizontally-extending metal line 524 is added in the scribe line areas, and which is connected to the test pad 512 of the dies along a corresponding row. In this case, the self-test may be activated simultaneously in a whole row of dies. This advantageously further reduces the number of probe-card pins required. A person skilled in the art could easily modify the scheme of pads internal to dies 502 to pads placed in the scribe lines in view of this disclosure. The pads would be connected directly to lines 520, 522 and 524 respectively. In yet another embodiment, where a reference voltage input is required, another pad is added for this purpose.

Figure 6:
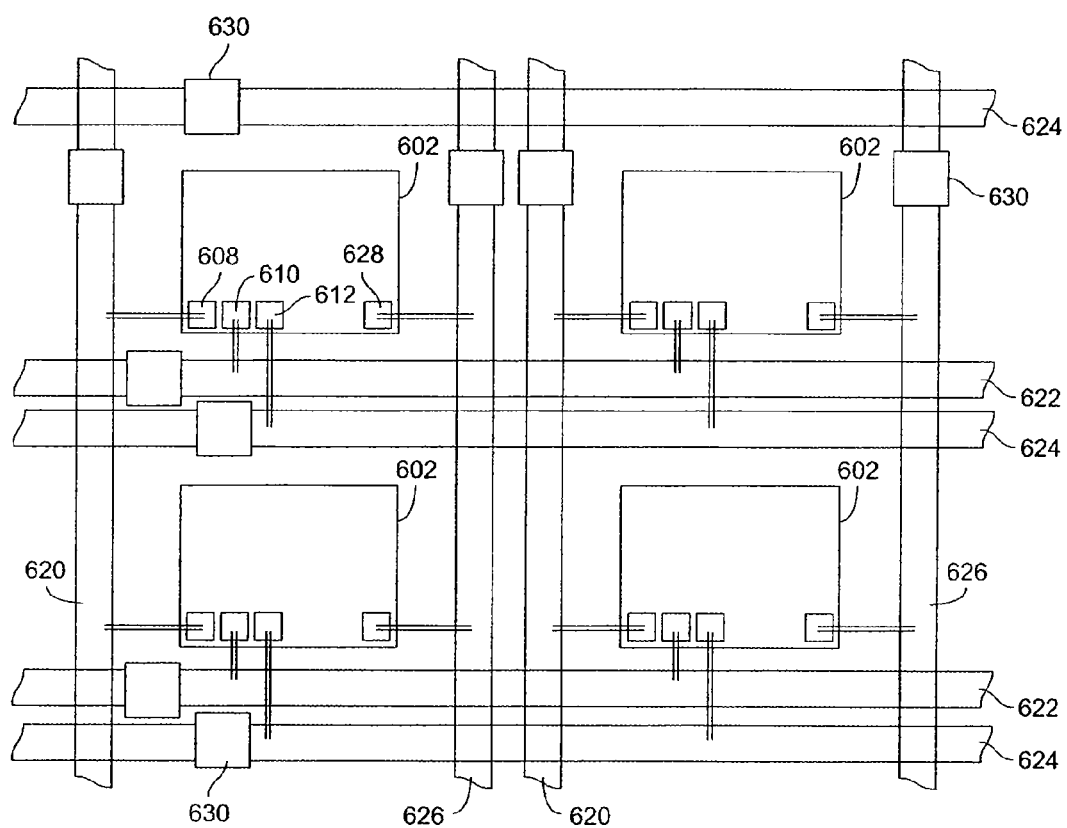
FIG. 6 is a schematic diagram of a portion of a wafer showing conductor lines with contact pads extending through scribe line areas in accordance with yet another embodiment of the invention.

Reference is now made to FIG. 6 where an additional vertically-extending metal line 626 is added in the scribe line areas, and which is connected to clock pads 628 in the dies along a corresponding column of dies. In this case, a whole column of devices may receive a clock signal simultaneously and operate in the manner described above where a separate clock pad is provided on each die. Pads 630 connected to lines 620, 622, 624, and 626 enable a probe card to touch these lines and activate multiple dies in parallel or one at a time as desired.

The above embodiments wherein metal lines extend through scribe line areas are not limited to the particular orientation of the metal lines. For example, the Vcc lines extending vertically may be changed to extend horizontally.

Following are a set of examples intended to illustrate the efficiencies achieved in testing wafers using the above-described embodiments. In all the following examples, it is assumed that the wafer has 1200 dies organized in 30 rows and 40 columns, and testing of each die takes one minute. Thus, if each die is tested separately, a total time of 1200 minutes is necessary to complete testing of all 1200 dies.

Using, for example, the FIG. 4 embodiment, a column (30 dies) can be tested simultaneously with a probe card having a total of 61 pins (one supply pin, 30 ground pins, and 30 test enable pins). The wafer test will take 1 minute per column and a total of 40 minutes for the wafer, a significant reduction using a simpler probe card and tester. The dies can be tested in rows in a similar manner.

If the probe card pins and the tester are capable of high current drive, it is possible to test the entire wafer (e.g., using the embodiment shown in FIG. 5) with a total of 100 pins (40 supply pins, one per column of dies; 30 ground pins, one per row of dies; and 30 test enable pins, one per row of dies). Test time would thus be one minute for the whole wafer. It is possible to test the entire wafer simultaneously using a probe card with even fewer than 100 pins. In a three-layer metal process, metal layers 1, 2, and 3 may be used to form lines 520, 522, and 524, respectively. This enables connecting together all vertically-extending lines 520 with metal layer 1, connecting all horizontally-extending lines 522 with metal layer 2, and connecting all horizontally-extending lines 524 with metal layer 3. Thus, with only three probe pins the entire wafer can be tested at once. This embodiment is not limited to the above assignment of the three metal layers to the three metal lines.

It is further possible to test the wafer in fields. A field could be an array of dies having, for example, six rows and eight columns. By testing all the dies in a field simultaneously, it would take one minute to test the entire field. The probe card would then move to continue the test on an untested field and repeat this process 25 times, hence, the test time would be 25 minutes. If each die in a field is to have its own three probe pins connected, a total of 144 pins would be required. However, it is possible to use either the row or column scheme described above so that a probe card with fewer number of pins may be used, e.g., a probe card with 20 pins (8 supply pins, 6 ground pins, and 6 test enable pins). In another embodiment, five fields in a row could be tested in parallel resulting, for example, in the use of a total of 100 pins. In this case the total test time would be eight minutes. Many other variations can be envisioned by one skilled in this art.

The foregoing descriptions of specific embodiments of the present invention have been presented for purposes of illustration and description. They are not intended to be exhaustive or to limit the invention to the precise forms disclosed, and it should be understood that many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method for testing a wafer in a tester, the wafer having a plurality of dies separated by scribe line areas, and further having one or more conductor lines extending through at least a portion of the scribe line areas, each die comprising a programmable self-test engine (PSTE), the method comprising:

bringing a probe card coupled to the tester into electrical contact with a test access point on the wafer, the test access point electrically connected to a predetermined number of the plurality of dies via the one or more conductor lines extending through at least a portion of the scribe line areas; and via the test access point, sending test data to each PSTE of each die of the predetermined number of the plurality of dies and initiating a self-test operation in the predetermined number of the plurality of dies at substantially the same time.

2. The method of claim 1 wherein each of the plurality of dies has at least three contact pads configured to receive three probe pins of the probe card, the one or more conductor lines having at least three conductor lines for electrically connecting the corresponding ones of the three contact pads of the predetermined number of dies together.

3. The method of claim 2 wherein the at least three pads comprise a supply contact pad, a ground contact pad, and a test contact pad, the test contact pad being connected to the programmable self-test engine (PSTE) embedded on the corresponding die.

4. The method of claim 1 wherein the predetermined number of dies is a column of dies.

5. The method of claim 1 wherein the predetermined number of dies corresponds to a row of dies.

6. The method of claim 1 wherein the predetermined number of dies is a field of m rows by n columns of dies.

7. A method for testing a wafer in a tester, the wafer having a plurality of dies separated by scribe line areas, and having a plurality of contact pads in the scribe line areas, at least one of the plurality of contact pads being electrically connected to one of the plurality of dies, the method comprising:

bringing a probe card coupled to the tester into electrical contact with the plurality of pads in the scribe line areas to send test data to each of a plurality of programmable self-test engines (PSTE) corresponding to each die of a predetermined number of the plurality of dies, and to initiate a self-test operation in each die of the predetermined number of the plurality of dies at substantially the same time.

8. The method of claim 7 wherein the plurality of contact pads includes a plurality of sets of contact pads, each set being associated with one of the predetermined number of the plurality of dies.

9. The method of claim 8 wherein each set of contact pads includes a power contact pad, a ground contact pad, and a test contact pad, and wherein each of the power, ground, and test pads of the set of contact pads are electrically connected to a corresponding power, ground, and test pad of a corresponding die.

10. A method for testing a wafer in a tester, the wafer having a plurality of dies separated by scribe line areas, each die comprising a programmable self-test engine (PSTE), the wafer further having a plurality of conductor lines extending through at least a portion of the scribe line areas and being selectively routed into predesignated groups of dies, one or more of the plurality of conductor lines having at least one contact pad, the method comprising:

bringing a probe card coupled to the tester into electrical contact with the at least one contact pad of the one or more of the plurality of conductor lines extending in the scribe line areas to send test data to each PSTE associated with each of the dies, and to initiate a self-test operation in at least one of the predesignated groups of dies.

11. The method of claim 10 wherein the plurality of conductor lines include a first conductor line having a power contact pad, a second conductor line having a ground contact pad, and a third conductor line having a tester contact pad, the probe card having at least three probe pins for contacting the first, second, and third contact pads during the step of brining the probe card in contact with the at least one contact pad.

12. The method of claim 10 wherein the at least one of the predesignated groups of dies is a column of dies.

13. The method of claim 10 wherein the at least one of the predesignated groups of dies is a row of dies.

14. The method of claim 10 wherein the at least one of the predesignated groups of dies is a field of m rows by n columns of dies.

15. A computer readable media with instructions to cause a microprocessor associated with a semiconductor wafer tester apparatus to perform the steps of:

bringing a probe card coupled to the semiconductor wafer tester apparatus into electrical contact with a test access point on a semiconductor wafer, the test access point electrically connected to a predetermined number of a plurality of dies on the semiconductor wafer via one or more conductor lines extending through at least a portion of a plurality of scribe line areas separating each of the plurality dies; and via the test access point, sending test data to each of a plurality of programmable self-test engines (PSTE) embedded in each die of a predetermined number of the plurality of dies and initiating a self-test operation in the predetermined number of the plurality of dies at substantially the same time.

16. The computer readable media of claim 15, wherein the predetermined number of the plurality of dies corresponds to a column of dies on the semiconductor wafer.

17. The computer readable media of claim 15, wherein the predetermined number of the plurality of dies corresponds to a row of dies on the semiconductor wafer.

18. The computer readable media of claim 15, wherein the predetermined number of the plurality of dies corresponds to a group of dies within a specified set of rows and columns on the semiconductor wafer.

* * * * *

UNITED STATES PATENT AND TRADEMARK OFFICE
CERTIFICATE OF CORRECTION

PATENT NO.        : 7,449,350 B2
APPLICATION NO.   : 11/614252
DATED             : November 11, 2008
INVENTOR(S)       : Ali Pourkeramati and Eungjoon Park It is certified that error appears in the above-identified patent and that said Letters Patent is hereby corrected as shown below:

In claim 11, at col. 8, line 16, please replace "brining" with "bringing"

Signed and Sealed this

Twenty-first Day of December, 2010

David J. Kappos
*Director of the United States Patent and Trademark Office*